United States Patent [19]

Lindberg

[11] 4,022,641
[45] May 10, 1977

[54] METHOD FOR MAKING BEAM LEADS FOR CERAMIC SUBSTRATES

[75] Inventor: Frank A. Lindberg, Catonsville, Md.

[73] Assignee: The United States of America as represented by the Secretary of the Navy, Washington, D.C.

[22] Filed: Apr. 2, 1976

[21] Appl. No.: 673,339

[52] U.S. Cl. .................... 156/650; 29/589; 29/630 R; 156/247; 156/289; 156/656; 156/645; 156/665; 156/666; 427/177; 427/259; 427/282; 427/284; 427/287
[51] Int. Cl.² .......................................... C23F 1/02
[58] Field of Search ............... 156/3, 6, 7, 8, 11, 156/17, 18, 247, 289; 29/589–591, 625, 626, 628, 629, 630 R, 630 A, 630 C; 357/69, 70; 317/101 A, 101 B, 101 CC; 174/68.5; 427/177, 178, 251, 259, 264, 269, 282, 284, 287, 270, 294; 164/46

[56] References Cited

UNITED STATES PATENTS

| 3,322,655 | 5/1967 | Garibotti et al. | 357/70 X |
| 3,487,541 | 1/1970 | Boswell | 156/3 X |
| 3,691,290 | 9/1972 | Napier | 174/68.5 |

Primary Examiner—William A. Powell
Attorney, Agent, or Firm—R. S. Sciascia; Paul S. Collignon

[57] ABSTRACT

A method for making beam leads for use in the interconnecting of electronic devices and packages. A first metal is deposited onto a substrate which has poor adhesion with the substrate. A portion of the deposited metal is then etched away leaving on said substrate deposited metal at locations where a second metal is not to adhere to the substrate. Then depositing onto said substrate and over said first deposited metal a plurality of beam leads of a second metal. Then lifting said portions of said first metal from said substrate and then etching away said first metal to provide beam leads partially attached to said substrate.

4 Claims, 16 Drawing Figures

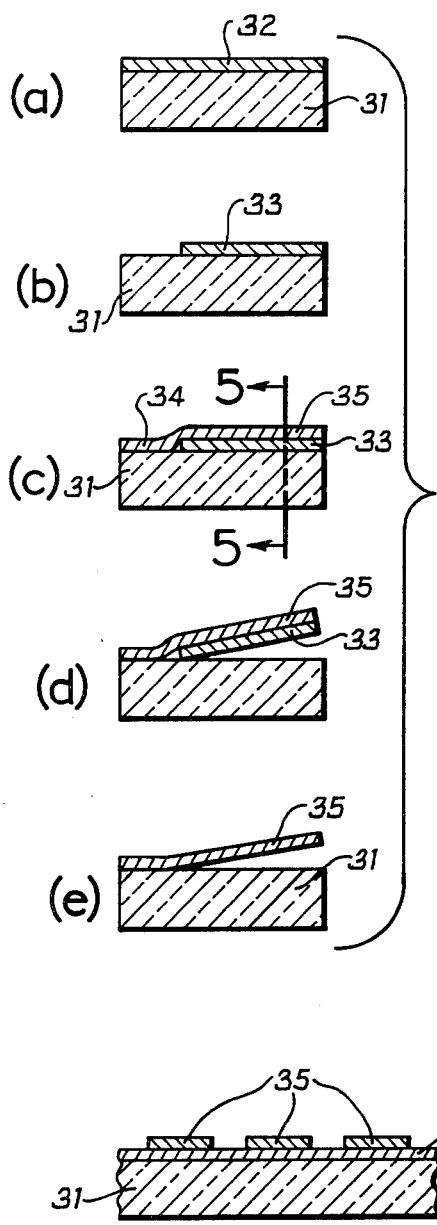
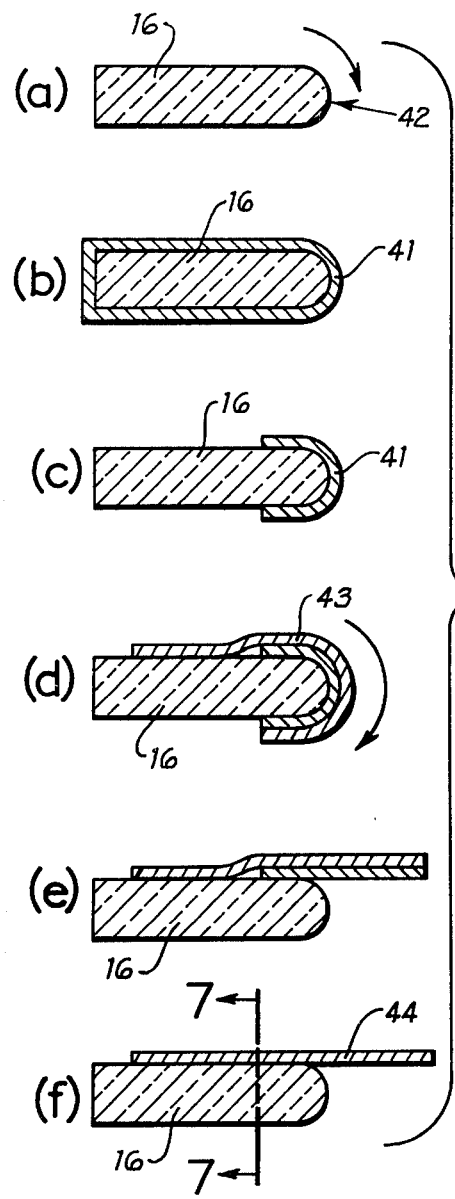
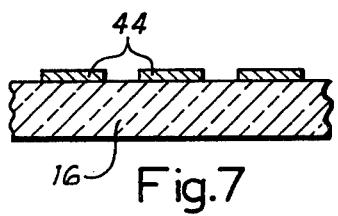

METHOD FOR MAKING BEAM LEADS FOR CERAMIC SUBSTRATES

CROSS-REFERENCE TO RELATED APPLICATION

Patent application of Ronald D. Hall, entitled, "Method For Making Beam Leads", Ser. No. 623,526, filed Oct. 17, 1975, now U.S. Pat. No. 3,971,428.

BACKGROUND OF THE INVENTION

The present invention relates to a method for making beam leads for interconnecting electronic packages on a substrate and also for interconnecting adjacent substrates.

The above-referenced patent application describes a method for making beam leads wherein a copper foil pattern is first etched, and then a second metal having poor adhesion with said copper foil is deposited onto the metal foil. The second metal is then separated from the copper foil and the foil is reusable as a depository for another deposition of the second metal which is the desired beam leads. The individual beam leads are preferably attached to the substrate or electronic assembly by an ultrasonic bonding technique. When the beam leads are used in a nonplanar configuration, a bending fixture is preferably used to shape the aluminum leads in order to prevent cracking and bending at the ultrasonic bond interface.

SUMMARY OF THE INVENTION

The present invention relates to a method for making beam leads for use in the interconnecting of electronic packages on substrates wherein a portion of the beam lead is attached, by depositing, onto a substrate. In one embodiment of the invention, a layer of copper is deposited onto a substrate and then a portion is etched away to form a pattern of pads where poor adhesion of the beam is desired. The beams are then deposited and, after copper between the beams is etched away, one end of the beam can be lifted to an elevated position and then the copper on the underside of the beam is etched away. One end of the beam lead is thus attached to the plane of the substrate circuitry and the other end of the lead can be elevated to another plane of circuitry which may be an integrated circuit chip, wafer, or other ceramic substrate.

In another embodiment of the invention beam leads are produced which extend over the edge of the substrate and which can be electrically connected to something adjacent the substrate, such as another substrate or bonding pads in a hermetic package. The substrate is provided with rounded ends and copper is deposited while rotating the substrate end over end to coat the rounded edges. Then all the copper except that which is covering the rounded edges is etched away. The substrate is then fitted with a metal mask which wraps around the rounded edges and the substrate is vapor deposited with aluminum while rotating end over end. The aluminum adheres to the substrate. After the mask is removed, the copper is etched away and the beams are straightened out or "uncurled" from around the edge. The copper on the bottom of the beam is etched away and the beams are ready for bonding.

It is therefore a general object of the present invention to provide an improved method for making aluminum beam leads which are formed integral with a substrate but having one end free to extend or be elevated relative to the substrate.

Other objects, advantages and novel features of the present invention will become apparent from the following detailed description of the invention when considered in conjunction with the accompanying drawings.

BRIEF DESCRIPTION OF THE DRAWINGS

FIGS. 4(a)–4(d) are views, in section, showing the various method steps of one embodiment of the present invention;

FIG. 5 is a sectional view taken on line 5—5 of FIG. 4(c);

FIGS. 6(a)–6(f) are views, in section, showing the various method steps of another embodiment of the present invention; and FIG. 7 is a sectional view taken on line 7—7 of FIG. 6(f).

DESCRIPTION OF THE PREFERRED EMBODIMENT

Figure 1:
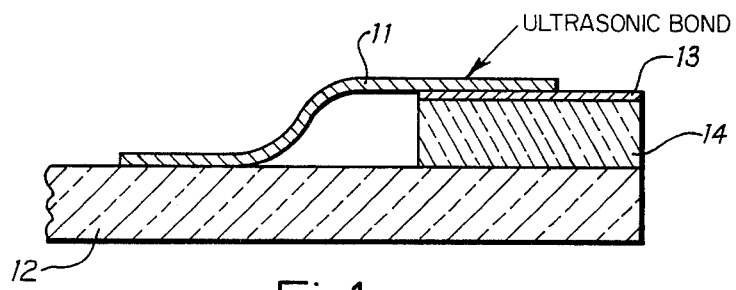
FIG. 1 is a sectional view showing a lead attached to substrates at different levels.

Referring first to FIG. 1 of the drawings, there is shown a conductive lead 11 which is deposited on and interconnects a first substrate 12 with a terminal 13 on a second substrate 14 which is at a different level than the level of the first substrate 12. Other electronic devices, such as large scale integrated chips or transistor chips may also be at a different level than the level of the first substrate 12 and may be connected by a conductive lead 11. By way of example, lead 11 is attached to terminal 13 by ultrasonic bonding.

Figure 2:
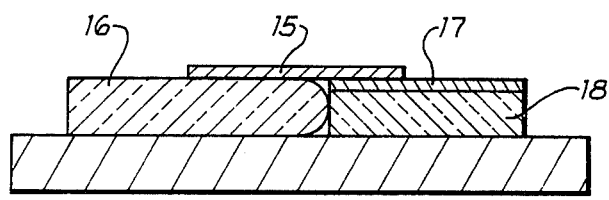
FIG. 2 is a sectional view showing a lead attached to two adjacent substrates.
Figure 3:
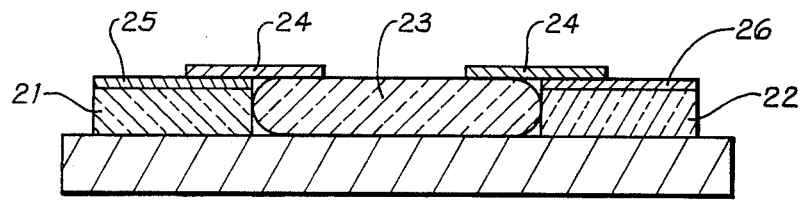
FIG. 3 is a sectional view showing three substrates being connected by leads.

In FIG. 2 of the drawings, there is shown a conductive lead 15 interconnecting a substrate 16 and a terminal 17 on a second substrate 18. Substrate 18 is adjacent substrate 16 and on the same level. Conductive lead 15 is deposited onto substrate 16 and its outer end is detached from substrate 11 and straightened, as hereinafter described. FIG. 3 of the drawings shows two substrates 21 and 22 adjacent a substrate 23 having leads 24 deposited thereon and these leads extend over and connect terminals 25 and 26 on the adjacent substrates. Other electronic devices might also be connected by leads 24 extending from substrate 23.

Referring now to FIG. 4(a) of the drawings, there is shown a ceramic substrate 31 having a layer of metal 32 deposited thereon. The metal 32 is selected so that there will not be good adhesion between the metal and the ceramic substrate 31. By way of example, one such metal is copper. Next a plurality of pads 33 are formed by etching the metal 32. The pads 33 are located at places on the substrate 31 where poor adhesion of the beams is desired. The final circuit patter 34 is next deposited onto the substrate 31 through a mask to a thickness of several mils. By way of example, the final circuit pattern 34, in addition to having a plurality of beam 35, as shown in FIG. 5 of the drawings, might also have conductors, resistors, capacitors and the like, deposited thereon, as is well-known in the printed circuitry art. As shown in FIG. 5 of the drawings, metal 33 extends not only beneath beams 35, but also beneath the spaces between adjacent beams and this metal is next etched away and, when gone, the beams can be lifted to an elevated position, as shown in FIG. 4(d).

The metal 33 on the underside of the beams 35 is then etched away and beam leads 35 are provided that are attached to substrate 31 and have one end free so that they can be lifted to a higher level for bonding to another element, such as shown in FIG. 1 of the drawings.

Referring now to FIG. 6 of the drawings, there is shown a second embodiment of the present invention for making leads on a first substrate that can extend over to an adjacent substrate or component which is substantially on the same level as the first substrate. As shown in FIG. 6(a) of the drawings, one edge of the substrate 16 is rounded and substrate 16 is rotated while metal 14, such as copper, is deposited thereon in a vacuum chamber, which vacuum depositing procedure is well-known to those skilled in the art. Next, the metal 41 is etched so that only the metal covering the rounded edge 42 remains, as shown in FIG 6(c). Substrate 16 is then fitted with a metal mask which wraps around the rounded edge 42 and aluminum 43 or other metal is deposited thereon while substrate 16 is rotated end-over-end. Aluminum will adhere firmly to substrate 16. The copper or other metal 41 between the beam leads is then etched away and the beam leads are then straightened out or "uncurled" from around the rounded edge 42, as shown in FIG. 6(e). The metal 41 on the bottom of the beam leads is then etched away to form beam leads 44 which can be bonded to other leads or components, as shown in FIG. 2 of the drawings.

FIG. 3 of the drawings shows a substrate 23 having two rounded ends and the same procedure shown in FIG. 6 of the drawings can be used to produce leads extending from both sides of the substrate.

Aluminum has good adhesion when vapor is deposited onto ceramic substrates. In the event, however, that it is desired to deposit a metal for beam leads which does not firmly adhere to a ceramic substrate, it may be desirable to first deposit an underlayer of metal, such as tantalum or chromium, onto the substrate.

Obviously many modifications and variations of the present invention are possible in the light of the above teachings. It is therefore to be understood that within the scope of the appended claims the invention may be practiced otherwise than a specifically described.

I claim

1. A process for making beam leads for use in interconnecting adjacent substrates and electronic components thereon comprising the steps of,
   first rounding at least one end of a substrate in its depth dimension,
   then rotating said substrate end over end and depositing on said substrate during rotation, a metal having poor adhesion thereto whereby metal is deposited onto the top, bottom and sides of said substrate,
   then etching said metal to form at least one temporary pad having a portion of the top side of said substrate and a portion on the rounded end of said substrate,
   then depositing a second metal onto said substrate and over said at least one temporary pad to form a plurality of spaced beam leads,
   then lifting said temporary pad from said substrate thereby also raising a portion of said beam leads, and
   then etching away said temporary pad to provide a beam lead which is partly attached to said substrate and partly unattached from said substrate, with the unattached part extending beyond the rounded end of the substrate and being adaptable for attachment to an adjacent substrate.

2. A process for making beam leads for use in interconnecting substrates and electronic components thereon as set forth in claim 1 wherein said substrate is ceramic, said first metal is copper and said second metal is aluminum.

3. A process for making beam leads for use in interconnecting substrates and electronic components thereon as set forth in claim 1 wherein said substrate is provided with two rounded ends and said substrate is rotated end over end during deposition of said first and second metals whereby said first metal is deposited onto said rounded ends and said second metal is deposited over said first metal on said rounded ends.

4. A process for making lead beams for use in interconnecting substrates and electronic components thereon as set forth in claim 3 wherein said substrate is ceramic, said first metal is copper and said second metal is aluminum.

* * * * *